United States Patent
Cai et al.

(10) Patent No.: US 9,306,001 B1
(45) Date of Patent: Apr. 5, 2016

(54) UNIFORMLY DOPED LEAKAGE CURRENT STOPPER TO COUNTER UNDER CHANNEL LEAKAGE CURRENTS IN BULK FINFET DEVICES

(71) Applicants: International Business Machines Corporation, Armonk, NY (US); Globalfoundries, Inc., Grand Cayman (KY); STMicroelectronics, Inc., Coppell, TX (US)

(72) Inventors: Xiuyu Cai, Niskayuna, NY (US); Qing Liu, Watervliet, NY (US); Ruilong Xie, Niskayuna, NY (US); Chun-Chen Yeh, Clifton Park, NY (US)

(73) Assignees: INTERNATIONAL BUSINESS MACHINES CORPORATION, Armonk, NY (US); GLOBALFOUNDRIES INC., Grand Cayman (KY); STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 14/685,745

(22) Filed: Apr. 14, 2015

(51) Int. Cl.
| | |
|---|---|
| *H01L 21/761* | (2006.01) |
| *H01L 29/06* | (2006.01) |
| *H01L 29/66* | (2006.01) |
| *H01L 29/78* | (2006.01) |
| *H01L 27/088* | (2006.01) |
| *H01L 27/12* | (2006.01) |
| *H01L 21/8234* | (2006.01) |
| *H01L 27/092* | (2006.01) |
| *H01L 21/8238* | (2006.01) |
| *H01L 21/84* | (2006.01) |

(52) U.S. Cl.
CPC ...... *H01L 29/0638* (2013.01); *H01L 29/66795* (2013.01); *H01L 29/785* (2013.01); *H01L 21/823431* (2013.01); *H01L 21/823821* (2013.01); *H01L 21/845* (2013.01); *H01L 27/0886* (2013.01); *H01L 27/0924* (2013.01); *H01L 27/1211* (2013.01)

(58) Field of Classification Search
CPC ............... H01L 21/823431; H01L 21/823821; H01L 21/845; H01L 27/0886; H01L 27/0924; H01L 27/1211
USPC .................................... 257/400; 438/284, 294
See application file for complete search history.

(56) References Cited

U.S. PATENT DOCUMENTS

| | | | |
|---|---|---|---|
| 7,449,373 B2 | 11/2008 | Doyle et al. | |
| 7,719,043 B2 | 5/2010 | Yamagami et al. | |
| 8,114,746 B2 | 2/2012 | Wei et al. | |
| 8,445,342 B2 | 5/2013 | Yang et al. | |
| 8,497,171 B1 | 7/2013 | Wu et al. | |
| 2004/0150071 A1* | 8/2004 | Kondo ................... | H01L 21/845 257/623 |
| 2009/0278196 A1* | 11/2009 | Chang ............. | H01L 21/823412 257/328 |
| 2012/0138886 A1 | 6/2012 | Kuhn et al. | |

(Continued)

*Primary Examiner* — George Fourson, III
(74) *Attorney, Agent, or Firm* — Cantor Colburn LLP; Vazken Alexanian

(57) ABSTRACT

Embodiments are directed to a method of forming a leakage current stopper of a fin-type field effect transistor (FinFET). The method includes forming at least one fin having an active region, a non-active region and a channel region in the active region. The method further includes exposing a surface of the non-active region, wherein the exposed surface leads to a portion of the non-active region that is substantially underneath the channel region. The method further includes implanting dopants through the exposed surface of the non-active region to form the leakage current stopper region.

20 Claims, 18 Drawing Sheets

(56) References Cited

U.S. PATENT DOCUMENTS

| | | |
|---|---|---|
| 2012/0313170 A1 | 12/2012 | Chang et al. |
| 2013/0052778 A1 | 2/2013 | Liao et al. |
| 2013/0161763 A1 | 6/2013 | Ando et al. |
| 2013/0234215 A1 | 9/2013 | Okano |
| 2014/0191297 A1* | 7/2014 | Utomo ................ H01L 29/7855 257/288 |
| 2014/0302645 A1* | 10/2014 | Rodder ............. H01L 21/76243 438/162 |
| 2014/0332861 A1* | 11/2014 | Cheng ............... H01L 29/66795 257/288 |
| 2015/0001591 A1* | 1/2015 | Akarvardar ........... H01L 29/785 257/288 |
| 2015/0028348 A1* | 1/2015 | Jacob .................... H01L 29/785 257/77 |
| 2015/0137237 A1* | 5/2015 | Jacob .................... H01L 29/785 257/347 |
| 2015/0162436 A1* | 6/2015 | Toh ....................... H01L 29/785 257/401 |
| 2015/0187944 A1* | 7/2015 | Ching ................ H01L 29/7851 257/190 |
| 2015/0221726 A1* | 8/2015 | Wong ................ H01L 29/1083 257/288 |

* cited by examiner

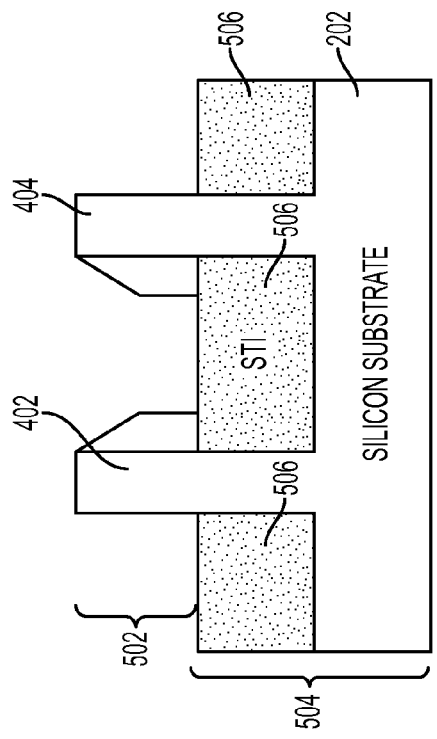
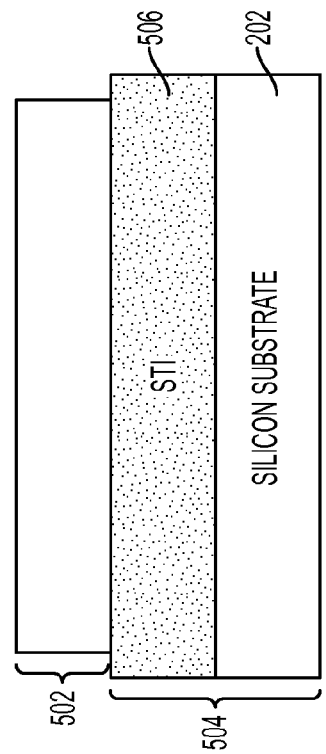
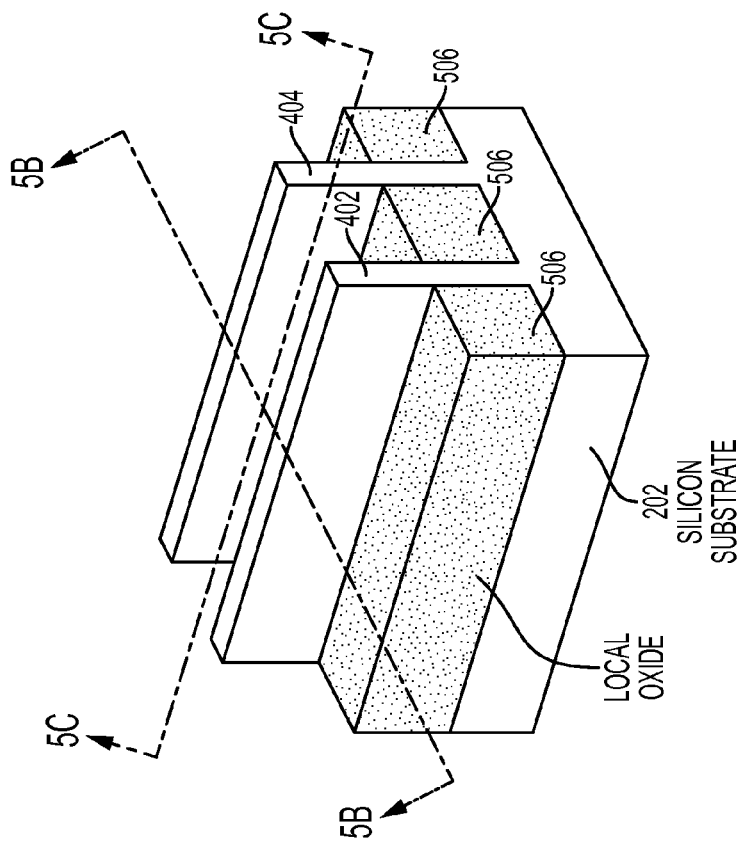

UNIFORMLY DOPED LEAKAGE CURRENT STOPPER TO COUNTER UNDER CHANNEL LEAKAGE CURRENTS IN BULK FINFET DEVICES

BACKGROUND

The present disclosure relates in general to semiconductor devices and their manufacture. More specifically, the present disclosure relates to the fabrication of a uniform leakage current stopper to counter under channel leakage currents in a fin-type field effect transistor (FinFET) device.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

One particularly advantageous type of MOSFET is known generally as a fin-type field effect transistor (FinFET). A three-dimensional view of an exemplary FinFET 100 is shown in FIG. 1A. The basic electrical layout and mode of operation of FinFET 100 do not differ significantly from a traditional field effect transistor. FinFET 100 includes a semiconductor substrate 102, a shallow trench isolation (STI) layer 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1A. In practice, FinFET devices are fabricated having multiple fins formed on STI 104 and substrate 102. Substrate 102 may be silicon, and STI 104 may be an oxide (e.g., $SiO_2$). Fin 106 may be silicon that has been enriched to a desired concentration level of germanium. Gate 114 controls the source to drain current flow (labeled ELECTRICITY FLOW in FIG. 1A). In contrast to a planar MOSFET, however, source 108, drain 110 and channel 112 are built as a three-dimensional bar on top of STI layer 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor.

FinFETs have been made successfully for mass manufacturing on bulk and silicon-on-insulator wafers. The demand for higher levels of integration includes a push to reduce transistor channel length. Several factors limit the ability to reduce transistor channel lengths past a certain level. For example, if the channel length is reduced such that it is shorter than an operational limit, undesirable results such as short channel effects and punch-through may occur. In general, punch-through occurs when, during an off state of the transistor, an under channel pathway extending through the substrate underneath the gate-controlled portion of the channel region allows leakage currents to pass from the source to the drain.

When choosing the bulk option to manufacture FinFETs, additional process steps are needed for substrate leakage suppression. Typically, a high-dose punch-through stop implant at the base of the fins is needed to create dopant junction isolation. This is especially true for pFET, because it is preferable to recess the fin deeper (beyond the gate/isolation boundary) to achieve both uniform junction formation from the top portion of the fin to the bottom portion of the fin, as well as enhanced embedded silicon germanium (eSiGe) stress coupling. Heavy substrate doping has been used to stop punch-through (i.e., leakage currents) from occurring between the source and drain. However, precise control of the doping profile to prevent its up-diffusion into the channel has been a challenging task, especially in the context of continuously shrinking device dimensions.

SUMMARY

Embodiments are directed to a method of forming a leakage current stopper of a FinFET device. The method includes forming at least one fin having an active region, a non-active region and a channel region in the active region. The method further includes exposing a surface of the non-active region, wherein the exposed surface leads to a portion of the non-active region that is substantially underneath the channel region. The method further includes implanting dopants through the exposed surface of the non-active region to form the leakage current stopper region.

Embodiments are further directed to a FinFET having at least one fin having an active region and a non-active region. The FinFET further includes a channel region in the active region of the at least one fin. The FinFET further includes a leakage current stopper region in the non-active region. The leakage current stopper region is formed by exposing a surface of the non-active region of the at least one fin, wherein the exposed surface leads to a portion of the non-active region that is substantially underneath the channel region. The leakage stopper region is further formed by implanting dopants through the exposed surface of the non-active region of the at least one fin.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIG. 5A depicts a three-dimensional view of a semiconductor device after an initial fabrication stage according to one or more embodiments;

FIG. 5B depicts a cross-sectional view of the semiconductor device shown in FIG. 5A, taken along line 5B-5B;

FIG. 5C depicts a cross-sectional view of the semiconductor device shown in FIG. 5A, taken along line 5C-5C;

DETAILED DESCRIPTION

Figure 1A:
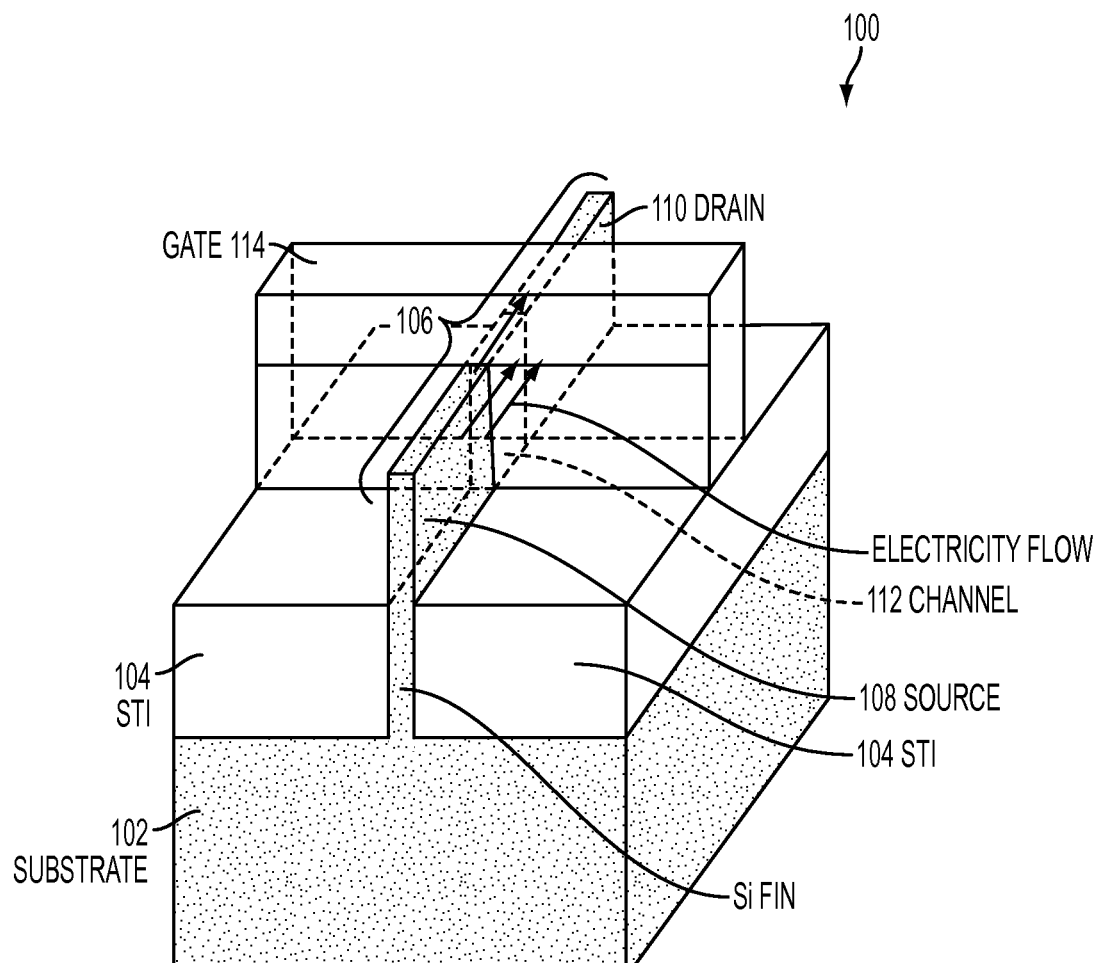
FIG. 1A depicts a three-dimensional view of an exemplary configuration of a known FinFET device.

It is understood in advance that although this disclosure includes a detailed description of an exemplary FinFET configuration having certain dimensions, implementation of the teachings recited herein are not limited to a particular FinFET structure and the dimensions disclosed herein. Rather, embodiments of the present disclosure are capable of being implemented in conjunction with any other type of fin-based transistor device now known or later developed.

As previously noted herein, FinFETs have been made successfully for mass manufacturing on bulk and silicon-on-insulator wafers. The demand for higher levels of integration includes a push to reduce transistor channel length. Several factors limit the ability to reduce transistor channel lengths past a certain level. For example, if the channel length is reduced such that it is shorter than an operational limit, undesirable results such as short channel effects and punch-through may occur. In general, punch-through occurs when, during an off state of the transistor, an under channel pathway extending through the substrate underneath the gate-controlled portion of the channel region allows leakage currents to pass from the source to the drain.

When choosing the bulk option to manufacture FinFETs, additional process steps are needed for substrate leakage suppression. Typically, a high-dose punch-through stop implant at the base of the fins is needed to create dopant junction isolation. This is especially true for pFET, because it is preferable to recess the fin deeper (beyond the gate/isolation boundary) to achieve both uniform junction formation from the top portion of the fin to the bottom portion of the fin, as well as enhanced eSiGe stress coupling. Heavy substrate doping has been used to stop punch-through (i.e., leakage currents) from occurring between the source and drain. However, precise control of the doping profile to prevent its up-diffusion into the channel is a challenging task, especially in the context of continuously shrinking device dimensions. For example, in known configurations, heavy substrate doping may be formed by ion implantation through the fin, which can cause random dopant fluctuations in the doping profile that result in mismatches between the fins. Additionally, although conformal doping is a desirable device characteristic, it is difficult to achieve in FinFET structures using ion implantation techniques due to the differences in impact angle, ion incorporation efficiency and the effect of wafer rotation. Moreover, shadowing represents an additional limitation for larger tilt angles when considering closely spaced fins. Further, if the implanted doping profile is formed too deep in the substrate beneath the fin, an undesirable short channel effect is created. Implantation through the fin also destroys the fin itself. When an implanted doping profile is not formed deep enough into the substrate, the dopant impurities of the doped layer occupy the lower portion of the fin especially after the high heat treatments that are typically used in semiconductor manufacturing. These high heat treatments can cause back-diffusion from the doped layer into the fin.

Figure 1B:
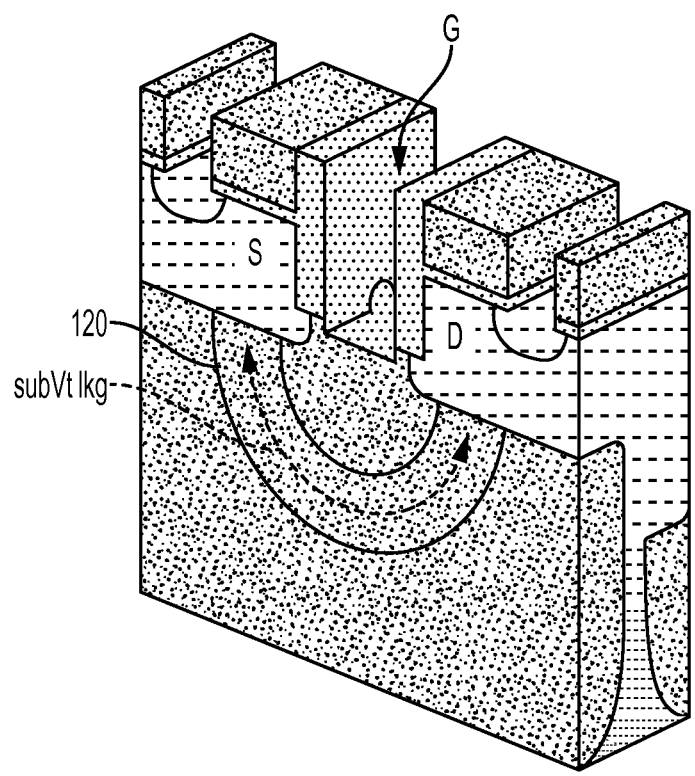
FIG. 1B depicts a three-dimensional view of an known FinFET illustrating under channel leakage currents.

FIG. 1B depicts an example of an under channel leakage pathway 120 that can occur in a typical bulk FinFET. As shown, under channel leakage pathway 120 is between the source (S) and the drain (D) and travels underneath the gate (G). During an on-state of the transistor, current flows from the source through the gate to the drain. In general, punch-through occurs when, during an off-state of the transistor, under channel pathway 120 extending through the substrate underneath the gate-controlled portion of the channel region allows leakage currents to pass from the source to the drain. The gate-controlled portion of the channel region is not generally subject to punch-through leakage currents. However, for the area underneath the gate-controlled portion of the channel region, which is generally defined by under channel leakage pathway 120, punch-through leakage current can occur. Punch-through leakage is dominated by sub-threshold leakage (labeled "subVtg lkg").

The present disclosure relates in general to semiconductor devices and their manufacture. More specifically, the present disclosure relates to the fabrication of a substantially uniform leakage current stopper to counter under channel leakage currents in a fin-type field effect transistor (FinFET) device. One or more embodiments provide a fin structure and fabrication methodology that uses a dummy spacer, along with a two-step fin recess operation to expose a surface of a non-active region of the device. The exposed surface leads to a portion of the non-active region that is substantially underneath the channel region. A plasma doping operation is applied through the exposed surface to locally dope the under-fin channel with carbon, thereby forming the substantially uniform leakage current stopper to counter under channel leakage currents. The leakage current stopper of the present disclosure counters and/or suppresses sub-threshold leakage current that may result from in-situ boron doped eSiGe under channel drive-in that causes device punch-through. Using the methodologies of the present disclosure to expose a surface of a non-active region of the device enables the application of plasma doping through the exposed surface, thereby avoiding the need to apply plasma doping by ion implantation through the fin. A FinFET fabricated according to one or more embodiments of the present disclosure can be formed on a bulk substrate, thereby forming a bulk FinFET device. In addition, a FinFET device fabricated according to the present disclosure can be utilized in a gate-first or a gate-last fabrication process. For example, the bulk FinFET device can be fabricated using a replacement gate process in which a dummy gate is first formed and then later replaced by a real gate.

Figure 2:
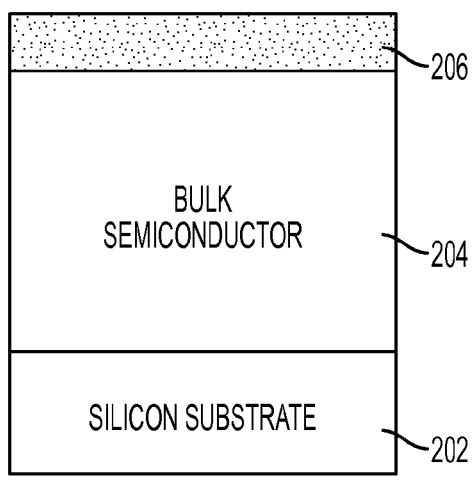
FIG. 2 depicts a semiconductor substrate, a bulk semiconductor material and a hard mask layer.
Figure 3:
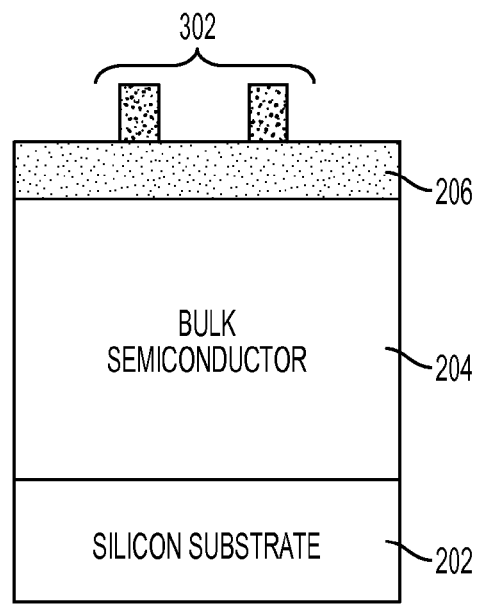
FIG. 3 depicts a patterned resist formed on the structure of FIG. 2.
Figure 4:
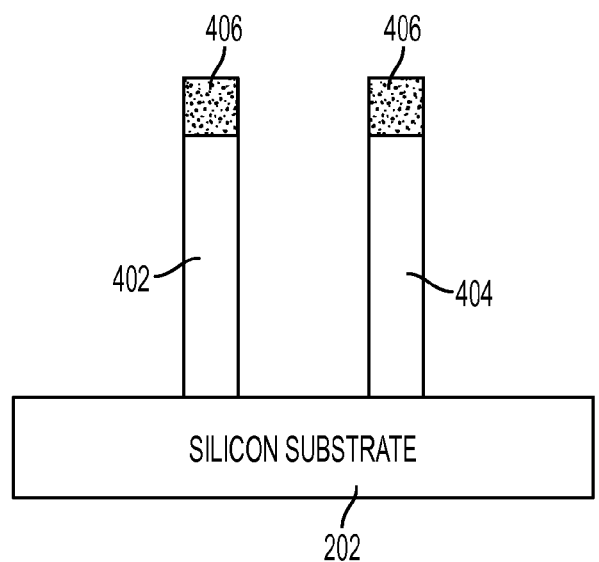
FIG. 4 depicts etching of the resist pattern into the hard mask layer and the bulk semiconductor material.

A preliminary fabrication methodology for forming initial stages of a FinFET semiconductor device in accordance with one or more embodiments of the present disclosure will now be described with reference to FIGS. 2-7C. Referring now to FIG. 2, an initial structure is formed having semiconductor substrate 202, a bulk semiconductor material 204 and a hard mask layer 206, configured and arranged as shown. It is noted that bulk semiconductor material 204 and semiconductor substrate 202 may be substantially the same material. Hard mask layer 206 may be a silicon nitride material (e.g., $Si_3Ni_4$). In FIG. 3, a patterned resist 302 is added over hard mask layer 206 to pattern and form fins 402, 404 (shown in FIG. 4) from bulk semiconductor 204. Fins 402, 404 may be formed by applying an anisotropic etch process, which results in the structure shown in FIG. 4. Because there is no stop layer on semiconductor substrate 202, the etch process is time based. Remaining portions 406 of the hard mask layer 206 may then optionally be removed from the fins 402, 404.

In FIGS. 5A, 5B and 5C, a local oxide (e.g., $SiO_2$) is deposited between fins 402, 404 and over substrate 202. The local oxide is polished and recessed back to form STI regions 506, and to expose upper portions 502, 504 of fins 402, 404. FIG. 5A depicts a three-dimensional view of a semiconductor device after an initial fabrication stage according to one or more embodiments. Additionally, FIG. 5B depicts a cross-sectional view of the semiconductor device shown in FIG. 5A, taken along line 5B-5B, and FIG. 5C depicts a cross-sectional view of the semiconductor device shown in FIG. 5A, taken along line 5C-5C. As shown in FIGS. 5A, 5B and 5C, the semiconductor device after this initial stage includes silicon substrate 202, STI regions 506 (approximately 60 nanometers) formed from a local oxide, fins 402, 404, active region 502, and inactive region 504, configured and arranged as shown.

Figure 6A:
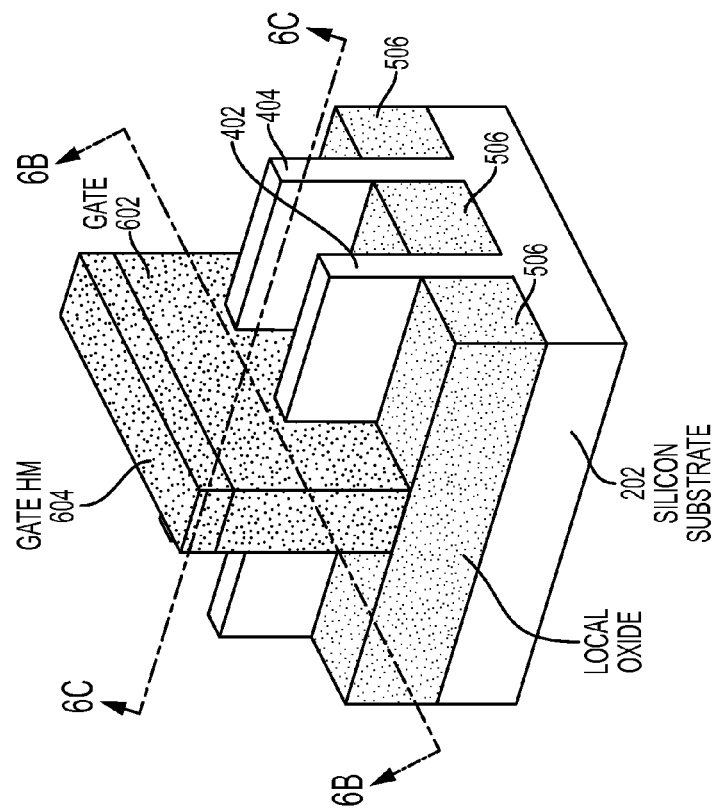
FIG. 6A depicts a cross-sectional view of a semiconductor device after an intermediate fabrication stage according to one or more embodiments.
Figure 6B:
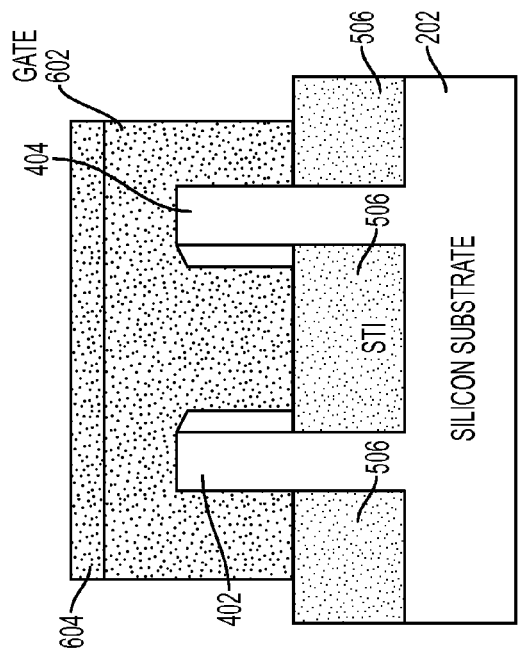
FIG. 6B depicts a cross-sectional view of the semiconductor device shown in FIG. 6A, taken along line 6B-6B.
Figure 6C:
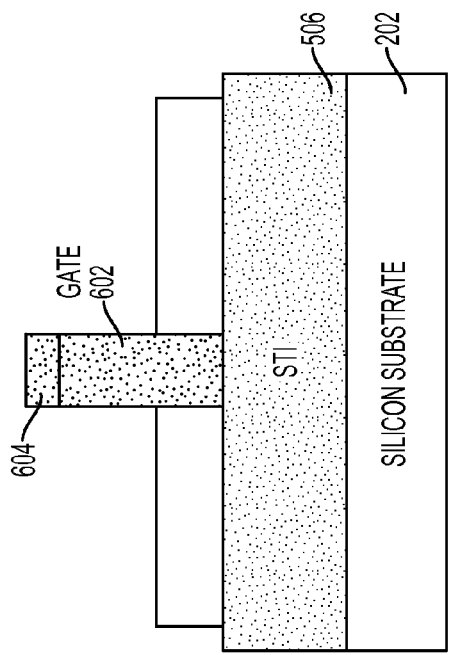
FIG. 6C depicts a cross-sectional view of the semiconductor device shown in FIG. 6A, taken along line 6C-6C.

As shown in FIGS. 6A, 6B and 6C, a gate 602 is formed over exposed upper portions of fins 402, 404 using an HK deposition process. Gate 602 may be either a high-K material or a dummy oxide. A dummy oxide would be used for device configurations in which gate 602 will be replaced in subsequent processing steps by a metal gate. Prior to forming gate 602, a hydrogen fluoride (HF) pre-clean is performed to clean the deposition surface prior to deposition. As also shown in FIGS. 6A, 6B, and 6C, a hard mask (HM) 604 is deposited over gate 602. The portions of fins 402, 404 that are surrounded by gate 602 form the channel region of the device.

Figure 7A:
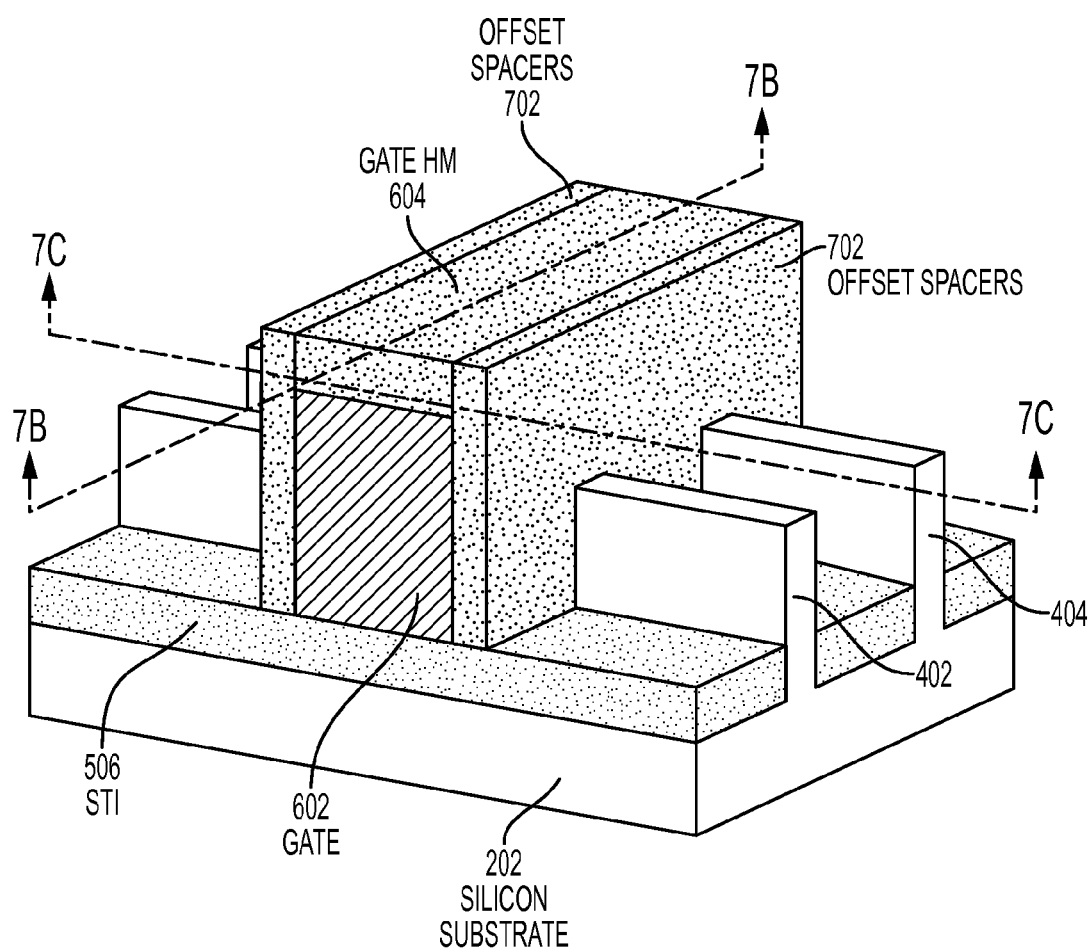
FIG. 7A depicts a cross-sectional view of a semiconductor device after an intermediate fabrication stage according to one or more embodiments.
Figure 7C:
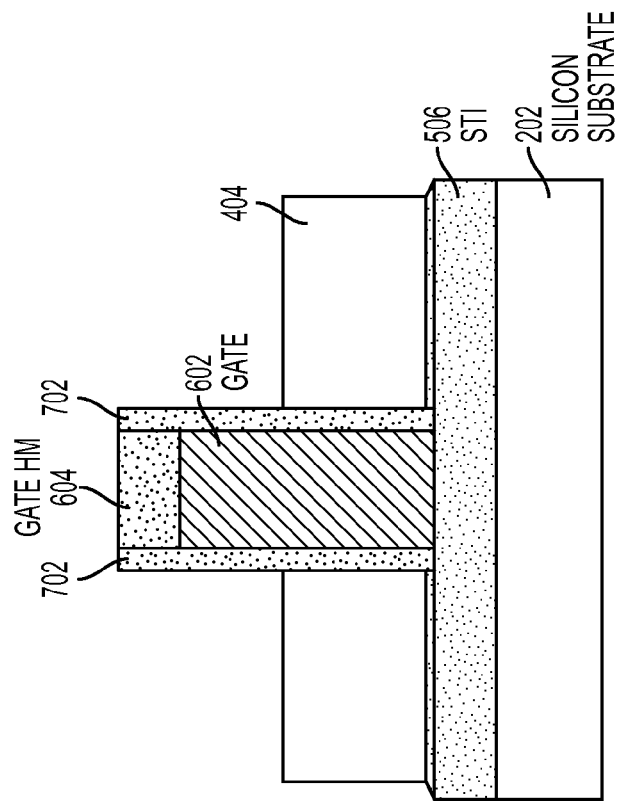
FIG. 7C depicts a cross-sectional view of the semiconductor device shown in FIG. 7A, taken along line 7C-7C.
Figure 7B:
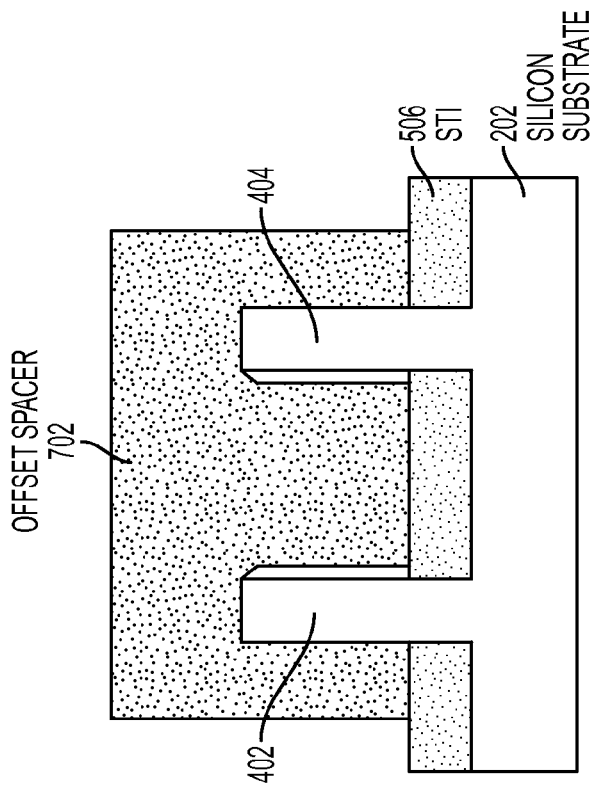
FIG. 7B depicts a cross-sectional view of the semiconductor device shown in FIG. 7A, taken along line 7B-7B.

As shown in FIGS. 7A, 7B and 7C, offset spacers 702 are formed along the sidewalls of gate 602, as shown. Offset spacers 702 may be formed using a spacer pull down formation process. Offset spacers 702 may also be formed using a sidewall image transfer (SIT) spacer formation process, which includes spacer material deposition followed by directional reactive ion etching (RIE) of the deposited spacer material. Suitable dimensions for the various components of the FinFET are shown in FIGS. 7A and 7B.

Figure 8A:
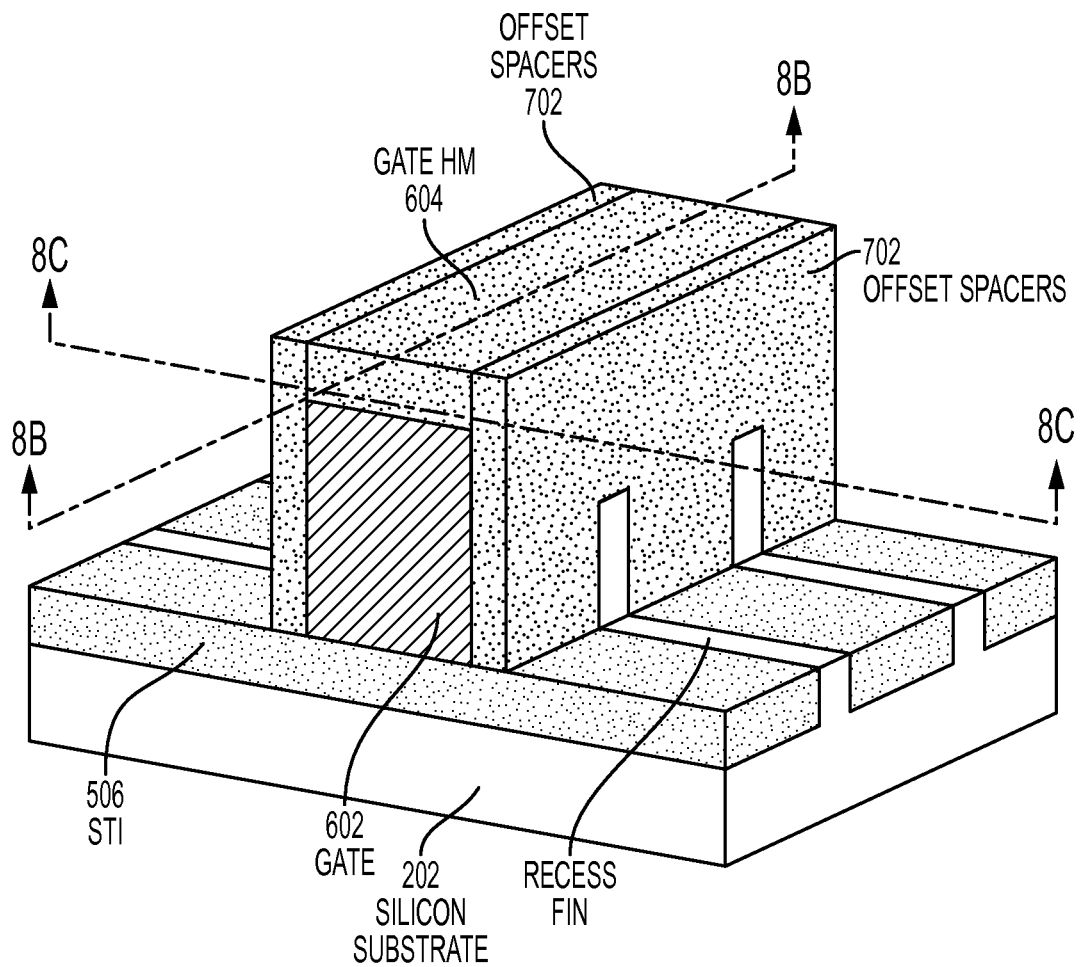
FIG. 8A depicts a cross-sectional view of a semiconductor device after an intermediate fabrication stage according to one or more embodiments.
Figure 8C:
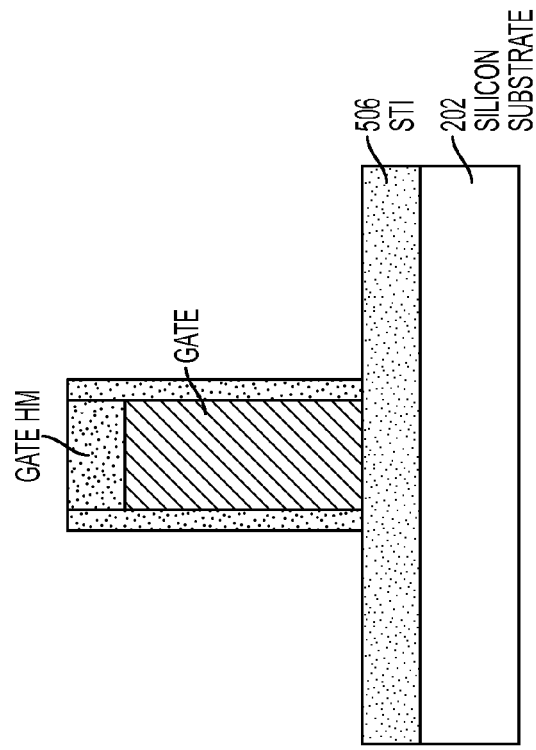
FIG. 8C depicts a cross-sectional view of the semiconductor device shown in FIG. 8A, taken along line 8C-8C.
Figure 8B:
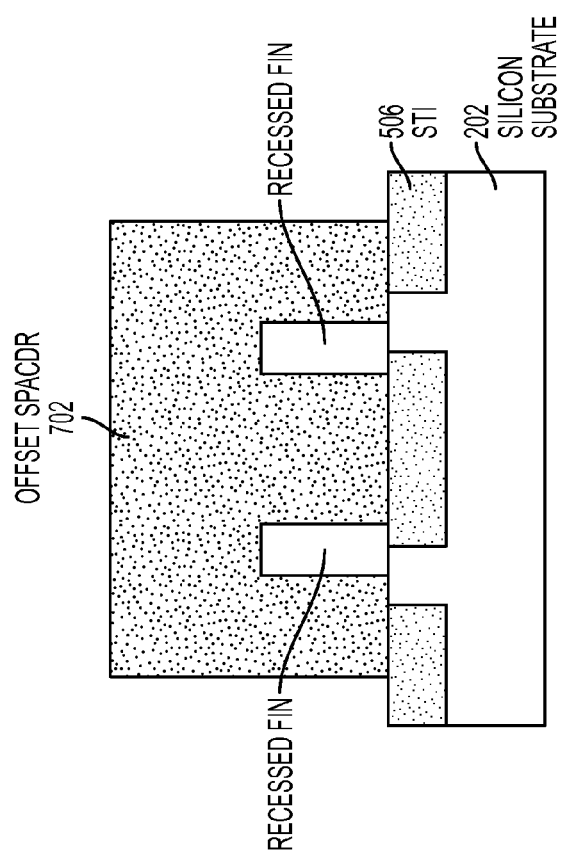
FIG. 8B depicts a cross-sectional view of the semiconductor device shown in FIG. 8A, taken along line 8B-8B.

As shown in FIGS. 8A, 8B and 8C, fins 402, 404 are recessed in the source drain region (by approximately 30-35 nanometers) using a silicon RIE process. The recessed fin can be controlled to extend to the gate/STI boundary such that the full channel width is exposed on offset spacers 702.

Figure 9A:
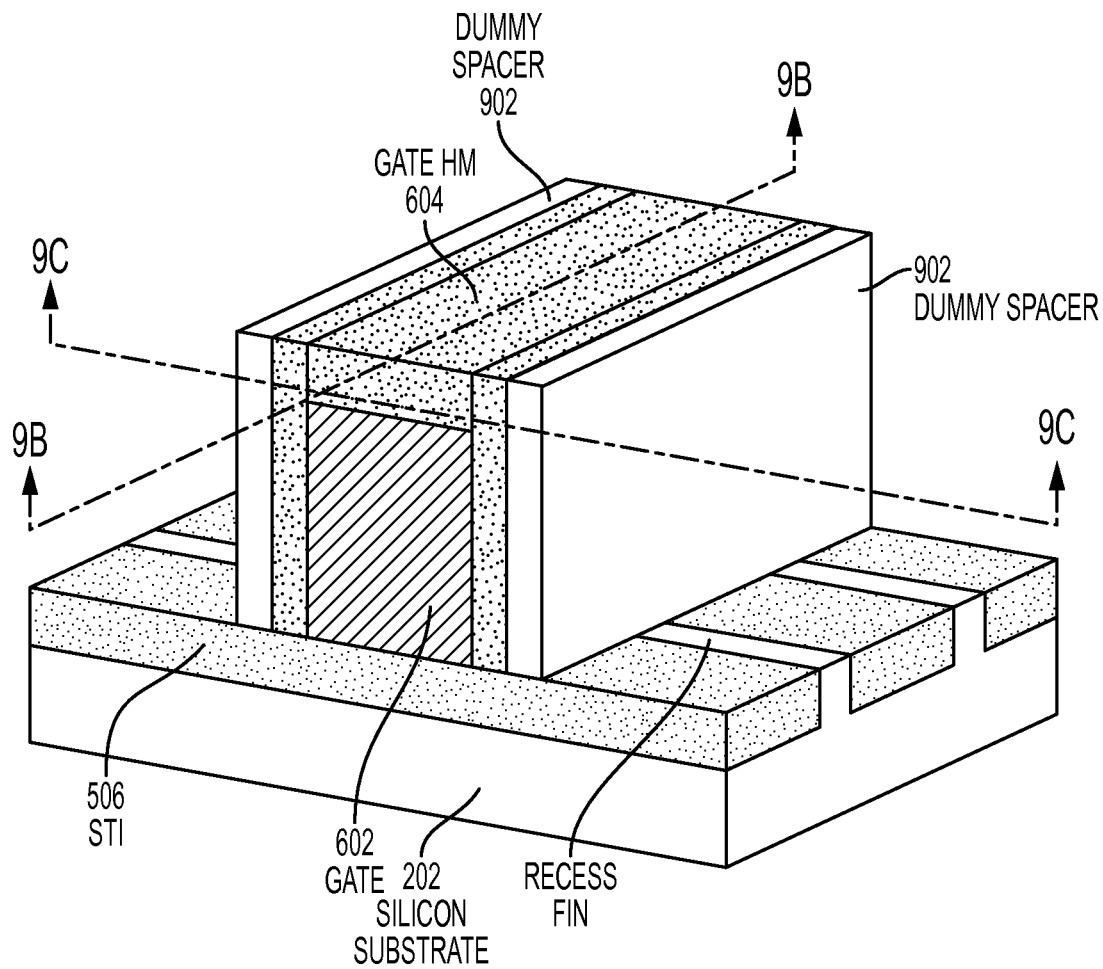
FIG. 9A depicts a cross-sectional view of a semiconductor device after an intermediate fabrication stage according to one or more embodiments.
Figure 9C:
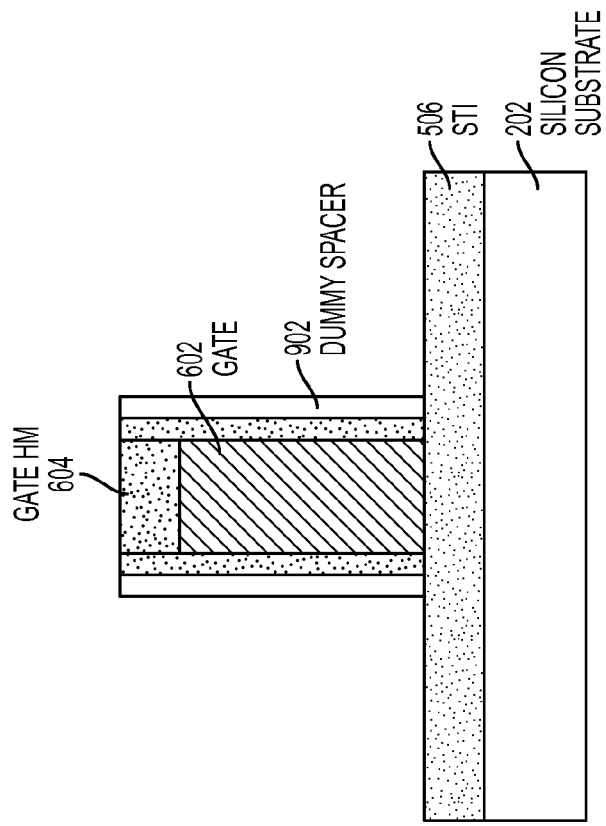
FIG. 9C depicts a cross-sectional view of the semiconductor device shown in FIG. 9A, taken along line 9C-9C.
Figure 9B:
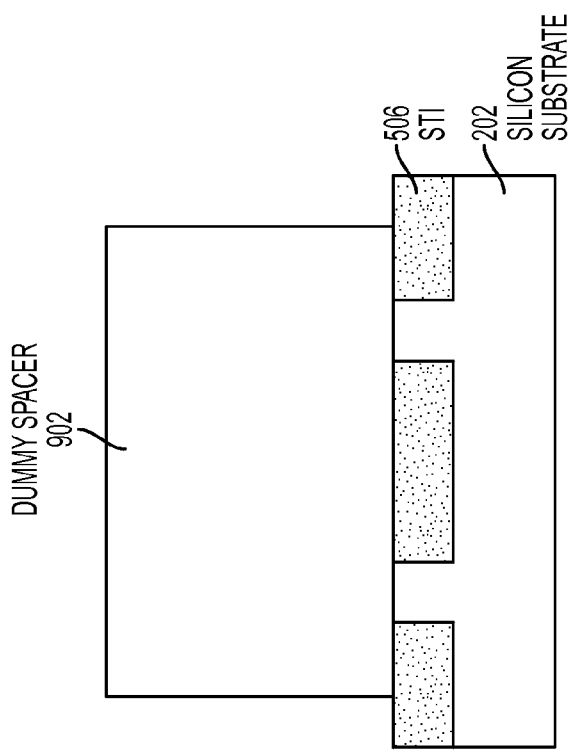
FIG. 9B depicts a cross-sectional view of the semiconductor device shown in FIG. 9A, taken along line 9B-9B.

As shown in FIGS. 9A, 9B and 9C, a layer of a dummy spacer 902 is deposited, as shown. Dummy spacer 902 may be formed from either silicon nitride or a high-k material. Dummy spacer 902 may also be formed from silicon dioxide, which provides better selectivity to offset spacers 702. The exposed recessed fin channel on the offset spacers 702 is covered again by dummy spacer 902. However, the bottom portion of the fin at the level of STI 506 is still exposed.

Figure 10A:
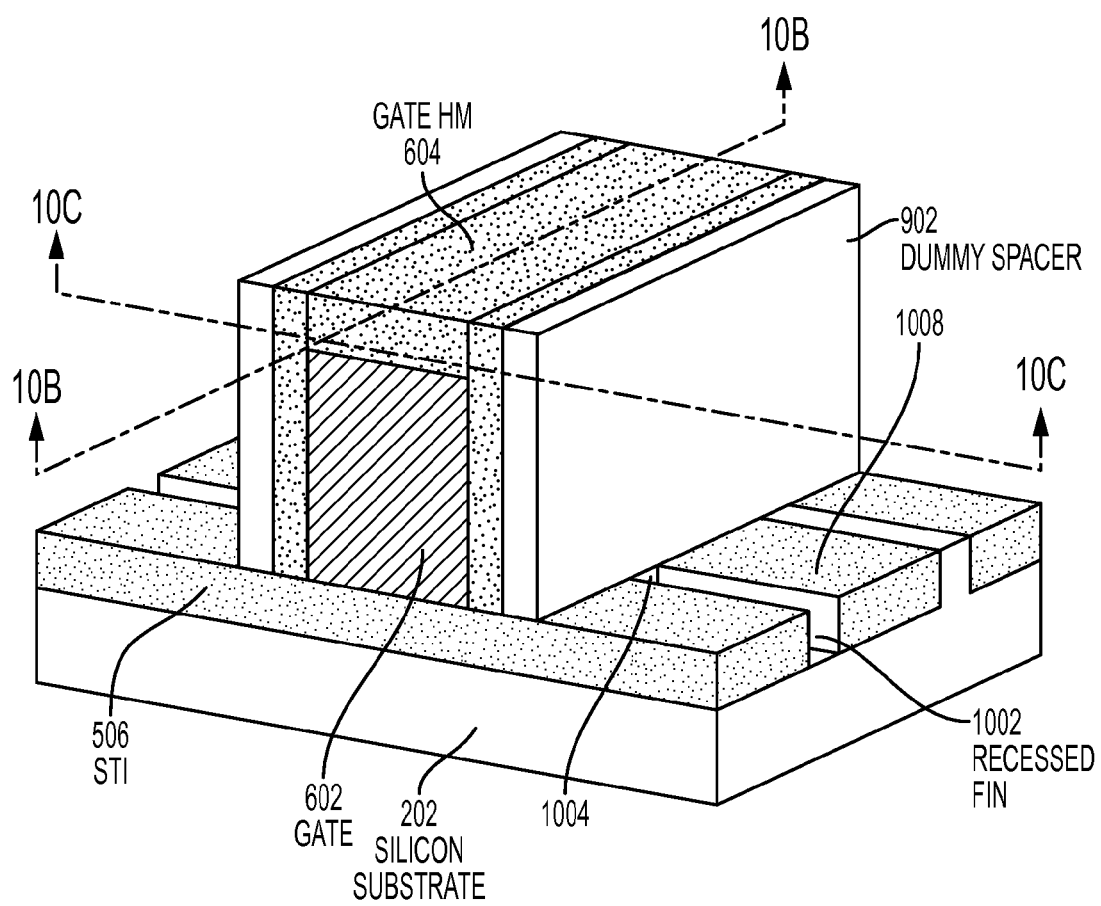
FIG. 10A depicts a cross-sectional view of a semiconductor device after an intermediate fabrication stage according to one or more embodiments.
Figure 10C:
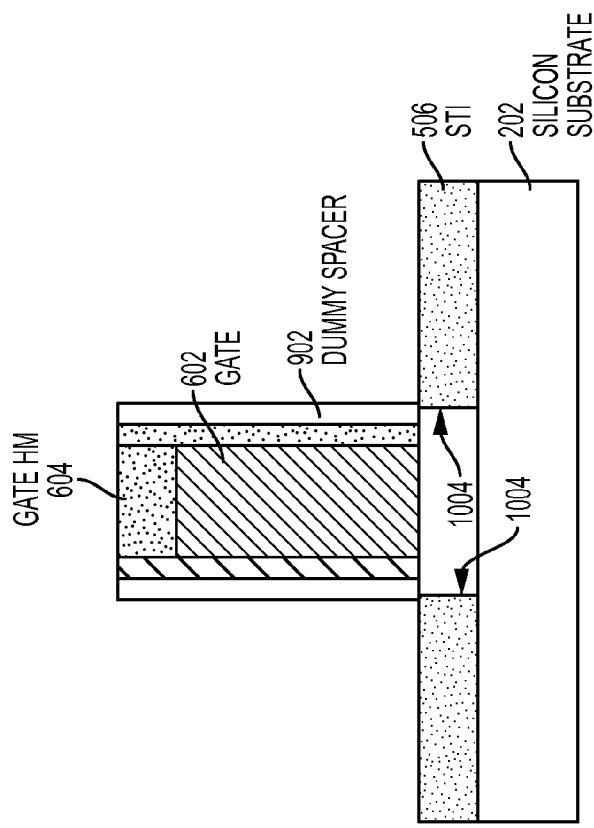
FIG. 10C depicts a cross-sectional view of the semiconductor device shown in FIG. 10A, taken along line 10C-10C.
Figure 10B:
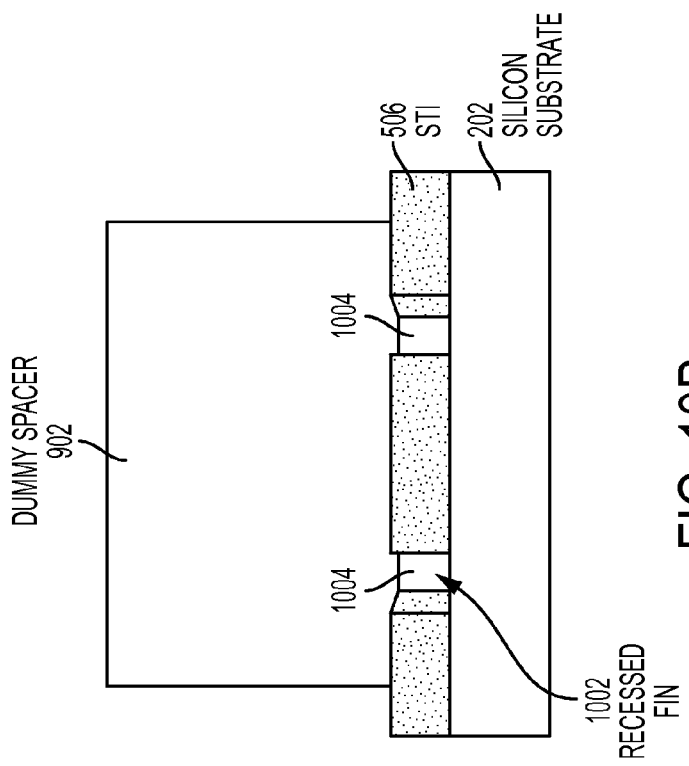
FIG. 10B depicts a cross-sectional view of the semiconductor device shown in FIG. 10A, taken along line 10B-10B.

As shown in FIGS. 10A, 10B and 10C, the fin is further recessed to form a recessed fin 1002 that exposes the silicon underneath the channel. The depth of recessed fin 1002 can be controlled to be approximately 10-20 nanometers below a top level of STI 506. Recessed fin 1002 also exposes a surface 1004. Surface 1004 leads to a portion of the non-active region 504 (shown in FIG. 5C) that is substantially underneath the channel region. In the embodiment shown in FIGS. 10A, 10B and 10C, surface 1004 is substantially vertical with respect to a major horizontal surface of the FinFET as defined by a top horizontal surface 1008 of STI 506. However, surface 1004 does not have to be substantially vertical and can have any orientation as long as surface 1004 leads to a portion of the non-active region 504 that is substantially underneath the channel region 1006.

Figure 11A:
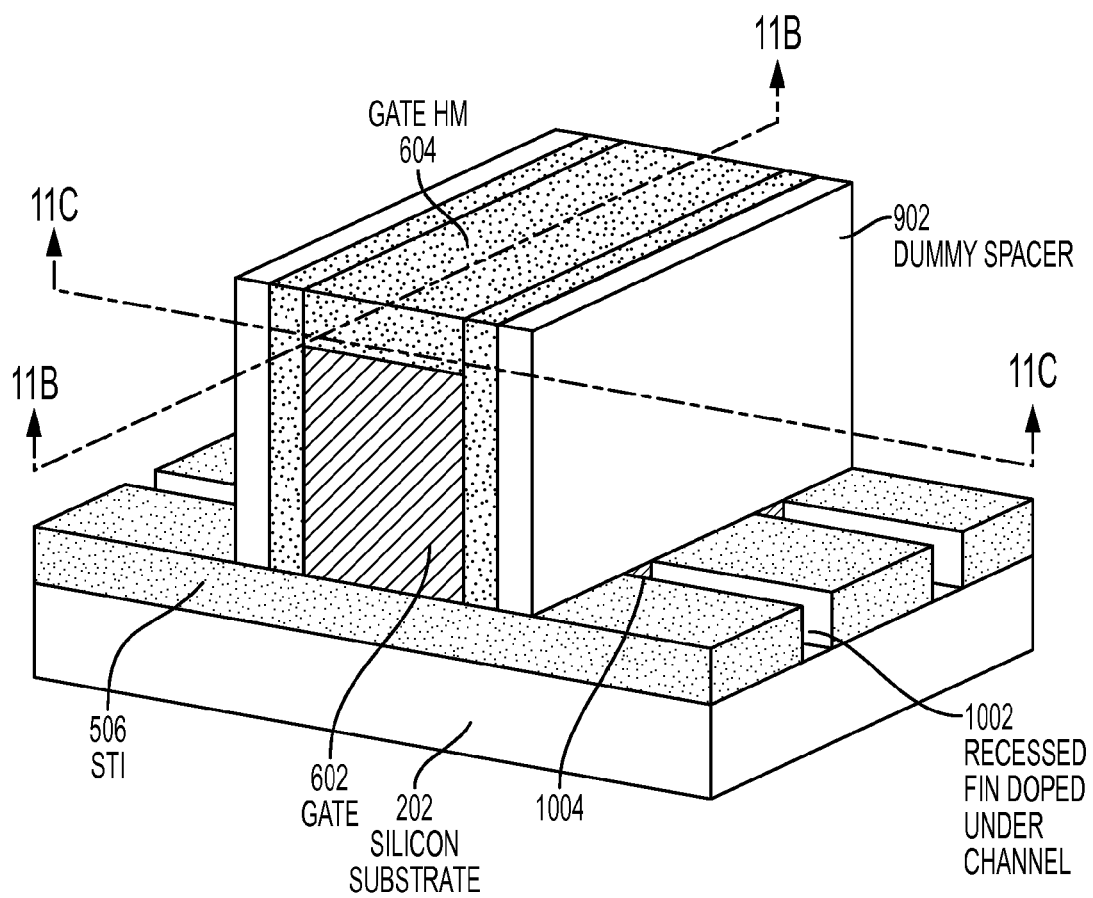
FIG. 11A depicts a cross-sectional view of a semiconductor device after an intermediate fabrication stage according to one or more embodiments.
Figure 11C:
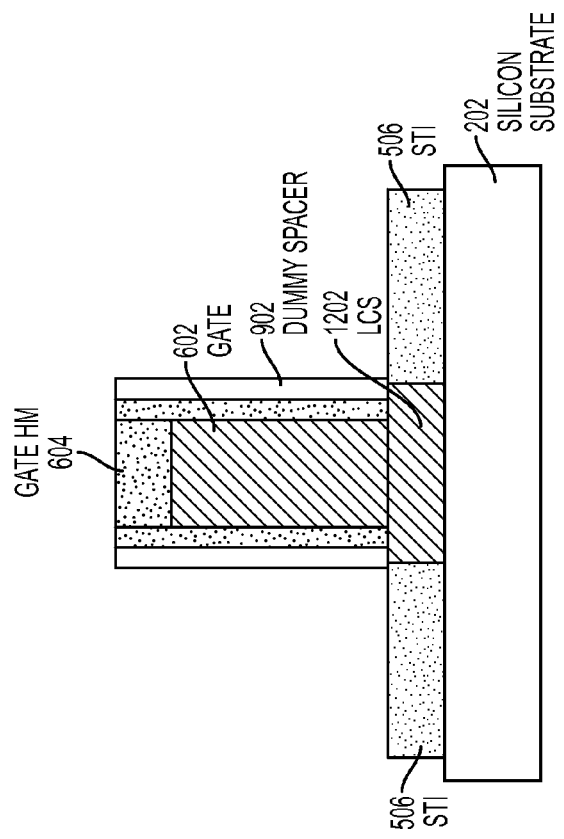
FIG. 11C depicts a cross-sectional view of the semiconductor device shown in FIG. 11A, taken along line 11C-11C.
Figure 11B:
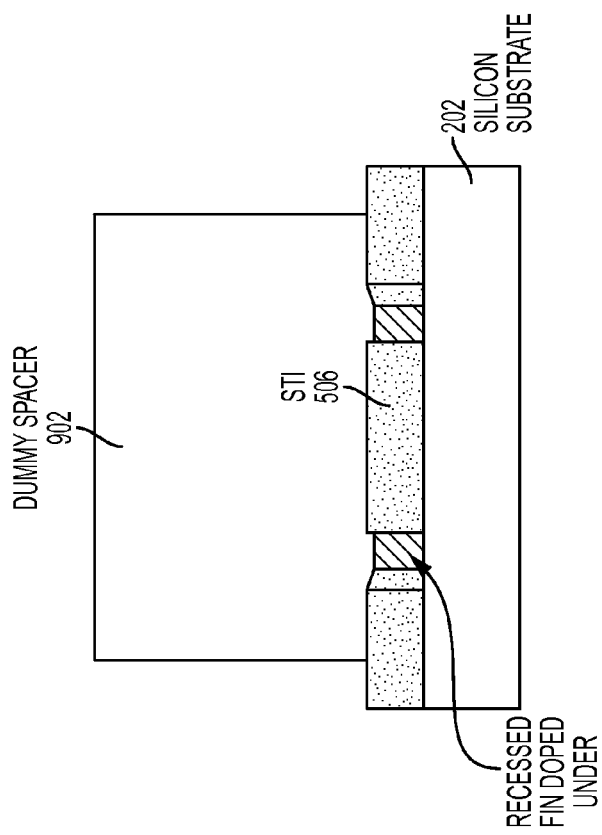
FIG. 11B depicts a cross-sectional view of the semiconductor device shown in FIG. 11A, taken along line 11B-11B.

As shown in FIGS. 11A, 11B and 11C, plasma doping is applied to surface 1004. Dummy spacer 902 protects the exposed portions of fins 402, 404 that are in active region 502 and surrounded by gate 602. Because surface 1004 is now exposed, this allows plasma doping to locally drive-in carbon through surface 1004 to form a self-aligned leakage current stopper (LCS) 1202 (best shown in FIG. 11C) underneath the fin channel region for suppressing the subsequent boron diffusion from in-situ doped eSiGe. Although a carbon dopant is disclosed, other dopants may be used as long as the dopant is sufficiently effective in suppressing the leakage current.

Figure 12A:
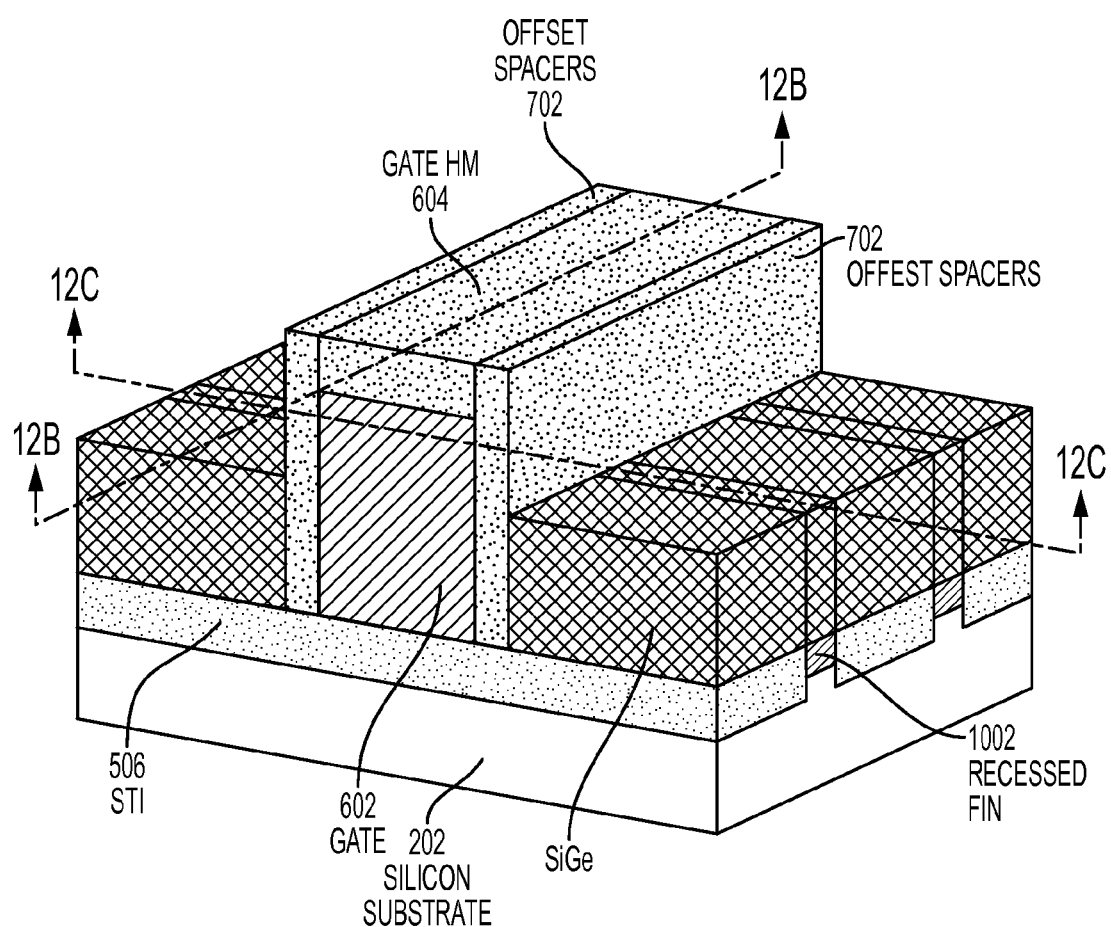
FIG. 12A depicts a cross-sectional view of a semiconductor device after an intermediate fabrication stage according to one or more embodiments.
Figure 12C:
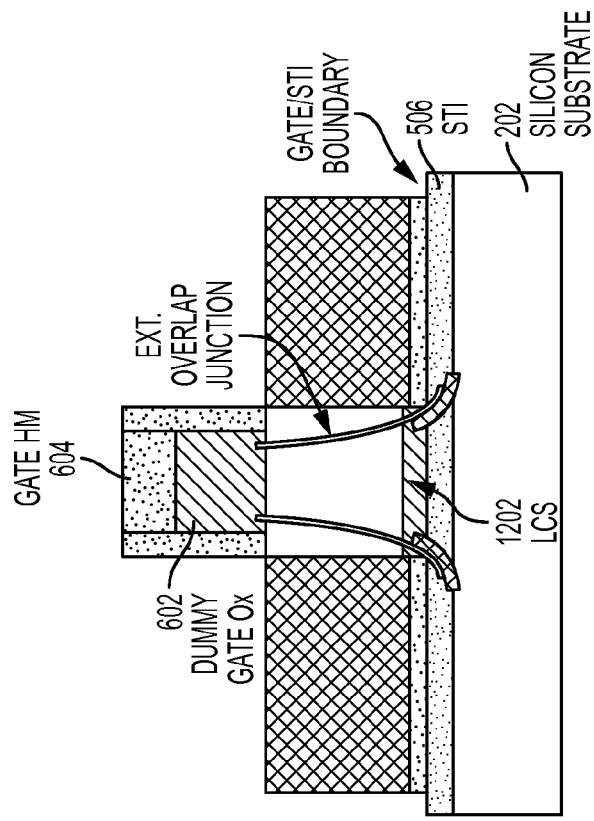
FIG. 12C depicts a cross-sectional view of the semiconductor device shown in FIG. 12A, taken along line 12C-12C.
Figure 12B:
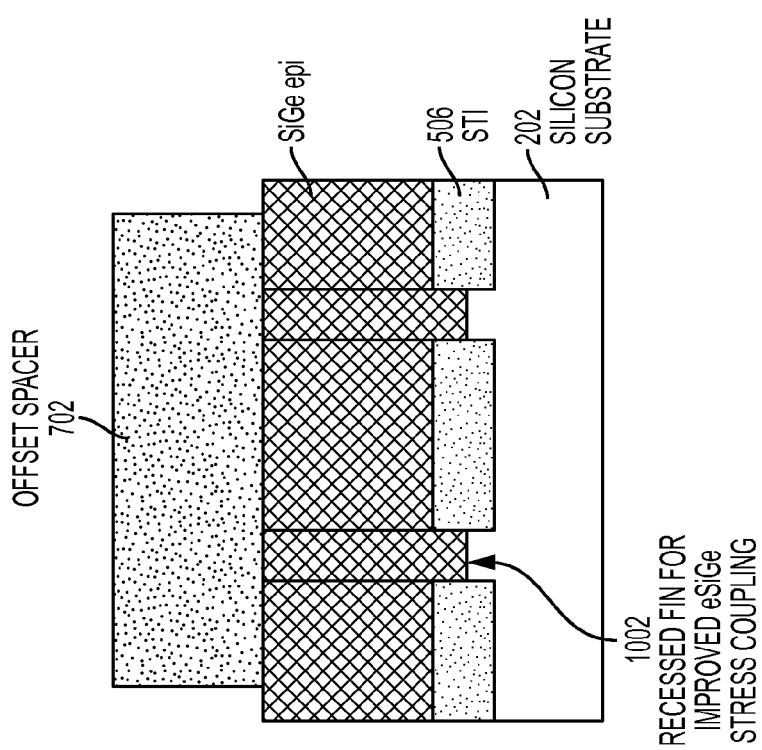
FIG. 12B depicts a cross-sectional view of the semiconductor device shown in FIG. 12A, taken along line 12B-12B.

As shown in FIGS. 12A, 12B and 12C, dummy spacer 902 is stripped away and STI 506 is refilled with SiGe to the original height of the source/drain sections of fins 402, 404. Because fins 402, 404 were previously recessed (e.g., by about 10-15 nanometers) below top surface 1008, the eSiGe stress coupling for mobility boost is enhanced. During a subsequent rapid thermal anneal (RTA) for extension junction formation, the dopant drive-in will be substantially uniform at the top 30 nanometers of fins 402, 404 but limited at the bottom of fins 402, 404 (e.g., below the gate/STI boundary).

As shown in FIGS. 12A, 12B and 12C, in a gate-last fabrication process, gate structure 902 comprises a dummy gate structure (shown in FIGS. 9A to 11C) that may be removed and replaced with a metal gate (not shown). In this alternative implementation, gate 602 can be removed by an etching process, e.g., RIE or chemical oxide removal (COR), to form a trench. A dielectric material and gate metal can then be deposited within the trench. For example, an HK (high-k) dielectric material, e.g., hafnium based material, can be deposited to form a gate dielectric. A metal liner, e.g., a work-function metal, and a gate metal can then be deposited on the dielectric material to complete the gate formation. In one or more embodiments, the metal liner can be, for example, TiN or TaN, and the gate metal can be aluminum or tungsten.

Figure 13:
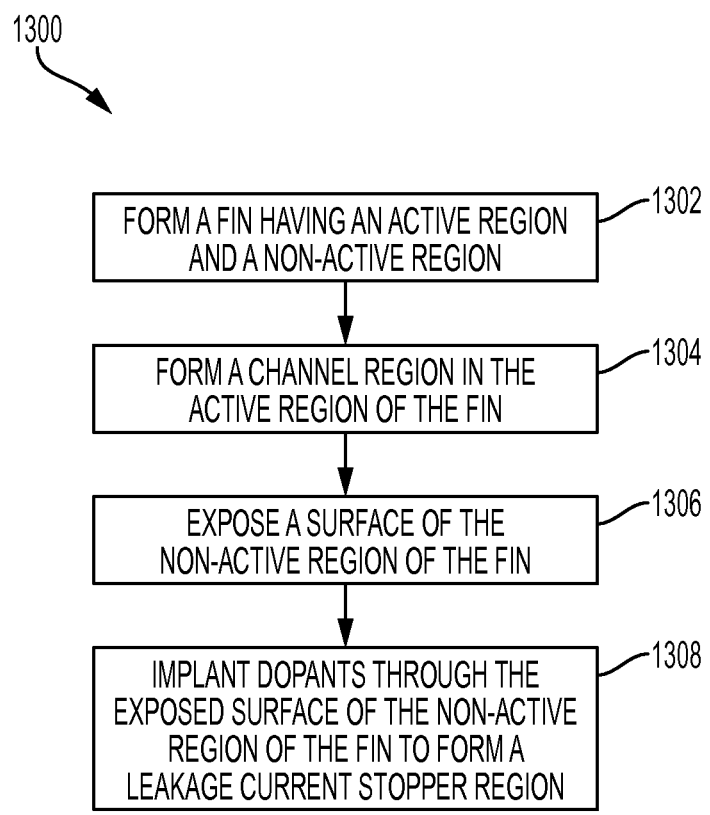
FIG. 13 is a flow diagram illustrating a methodology according to one or more embodiments.

FIG. 13 is a flow diagram illustrating a methodology 1300 according to one or more embodiments. At block 1302 a fin is formed having an active region and a non-active region. Block 1304 forms a channel region in the active region of the fin. Block 1306 exposes a surface of the non-active region of the fin. The exposed surface leads to a portion of the non-active region that is substantially underneath the channel region. Block 1308 implants dopants through the exposed surface of the non-active region of the fin to form a leakage current stopper region. The implanted dopants of the leakage current stopper region suppress a flow of leakage current from a source region the fin through the leakage current stopper region into a channel region of the fin. The implanted dopant is selected based at least in part on the dopant's ability to sufficiently suppress leakage currents.

Thus, it can be seen from the forgoing detailed description and accompanying illustrations that embodiments of the present disclosure provide structures and methodologies for providing a leakage current stopper in a FinFET device. As described above, one or more embodiments provide a fin structure and fabrication methodology that uses a dummy spacer, along with a two-step fin recess operation to expose a surface of a non-active region of the device. The exposed surface leads to a portion of the non-active region that is substantially underneath the channel region. A plasma doping operation is applied through the exposed surface to locally dope the under-fin channel with carbon, thereby forming the substantially uniform leakage current stopper to counter under channel leakage currents. The leakage current stopper of the present disclosure counters and/or suppresses sub-threshold leakage current that may result from in-situ boron doped eSiGe under channel drive-in that causes device punch-through. Using the methodologies of the present disclosure to expose a surface of a non-active region of the device enables the application of plasma doping through the exposed surface, thereby avoiding the need to apply plasma doping by ion implantation through the fin. A FinFET fabricated according to one or more embodiments of the present disclosure can be formed on a bulk substrate, thereby forming a bulk FinFET device. In addition, a FinFET device fabricated according to the present disclosure can be utilized in a gate-first or a gate-last fabrication process. For example, the bulk FinFET device can be fabricated using a replacement gate process in which a dummy gate is first formed and then later replaced by a real gate.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a leakage current stopper region of a fin-type field effect transistor (FinFET), the method comprising:
    forming at least one fin having an active region and a non-active region;
    forming a channel region in the active region of the at least one fin;
    exposing a surface of the non-active region of the at least one fin, the exposed surface leading to a portion of the non-active region that is substantially underneath the channel region; and
    implanting dopants through the exposed surface of the non-active region of the at least one fin to form the leakage current stopper region.

2. The method of claim 1 further comprising forming a source region and a drain region in the active region of the at least one fin.

3. The method of claim 2, wherein the implanted dopants of the leakage current stopper region suppress a flow of leakage current from the source region through the leakage current stopper region into the channel region.

4. The method of claim 3, wherein the implanted dopants comprises carbon.

5. The method of claim 2, wherein the leakage current stopper region extends under the channel region.

6. The method of claim 2 further comprising:
    forming a gate region around the channel region;

wherein the gate region controls a flow of current from the source region through the channel region into the channel region.

7. The method of claim 1, wherein the exposing of the surface of the non-active region comprises:
   recessing a portion of the active region to expose a portion of the non-active region.

8. The method of claim 7, wherein the exposing of the surface of the non-active region further comprises:
   recessing the portion of the non-active region to expose the surface of the non-active region.

9. The method of claim 7 further comprising:
   during the implanting of the dopants, blocking the dopants from entering the recessed portion of the active region.

10. The method of claim 1, wherein the implanting of the dopants through the exposed surface of the non-active region results in a substantially uniform distribution of dopants in the leakage current stopper region.

11. The method of claim 1, wherein the implanting of the dopants through the exposed surface of the non-active region substantially prevents dopants from entering the active region of the at least one fin.

12. A fin-type field effect transistor (FinFET) comprising:
   at least one fin having an active region and a non-active region;
   a channel region in the active region of the at least one fin;
   a leakage current stopper region in the non-active region;
   the leakage current stopper region formed by:
   exposing a surface of the non-active region of the at least one fin, the exposed surface leading to a portion of the non-active region that is substantially underneath the channel region; and
   implanting dopants through the exposed surface of the non-active region of the at least one fin to form the leakage current stopper region.

13. The FinFET of claim 12 further comprising:
   a source region and a drain region in the active region of the at least one fin.

14. The FinFET of claim 13, wherein the implanted dopants of the leakage current stopper region suppress a flow of leakage current from the source region through the leakage current stopper region into the channel region.

15. The FinFET of claim 14, wherein the implanted dopants comprise carbon.

16. The FinFET of claim 13, wherein the leakage current stopper region extends under the channel region.

17. The FinFET of claim 13 further comprising:
   a gate region around the channel region, wherein the gate region controls a flow of current from the source region through the channel region into the channel region.

18. The FinFET of claim 12, wherein the exposing of the surface of the non-active region comprises:
   recessing a portion of the active region to expose a portion of the non-active region.

19. The FinFET of claim 18, wherein the exposing of the surface of the non-active region further comprises:
   recessing the portion of the non-active region to expose the surface of the non-active region.

20. The FinFET of claim 1, wherein the leakage current stopper region comprises a substantially uniform distribution of the dopants.

* * * * *